United States Patent [19]

Matsumoto

[11] Patent Number: 4,539,521
[45] Date of Patent: Sep. 3, 1985

[54] MAGNETIC FIELD MEASURING DEVICE

[75] Inventor: Mitsuo Matsumoto, Kokubunji, Japan

[73] Assignee: Tokyo Shibaura Denki Kabushiki Kaisha, Kawasaki, Japan

[21] Appl. No.: 516,464

[22] Filed: Jul. 22, 1983

[30] Foreign Application Priority Data

Jul. 27, 1982 [JP] Japan .................. 57-129524

[51] Int. Cl.³ .............................. G01R 33/02
[52] U.S. Cl. ............................ 324/244; 250/225; 250/231 R; 350/377; 324/96; 356/364
[58] Field of Search .............. 250/225, 231 R; 324/96, 324/244; 350/377; 356/364

[56] References Cited

U.S. PATENT DOCUMENTS 2,442,396 6/1948 Bubb et al. .................. 350/377 X
3,693,082 9/1972 Jaecklin .................. 250/225 X

FOREIGN PATENT DOCUMENTS 1918730 11/1969 Fed. Rep. of Germany .
2758611 7/1979 Fed. Rep. of Germany .
3019030 12/1980 Fed. Rep. of Germany .
3141325 4/1983 Fed. Rep. of Germany .
4412100 4/1966 Japan .................. 324/96

OTHER PUBLICATIONS

Bucaro et al., "Measurement of Sensitivity of Optical Fibers for Acoustic Detection", Applied Optics, vol. 18, No. 6 (3/15/79), pp. 938-940.
Rapp et al., "Magneto Optical Current Transformer", Applied Optics, vol. 19, No. 22 (11/15/80), pp. 3729-3734.

Primary Examiner—Edward P. Westin
Attorney, Agent, or Firm—Schwartz, Jeffery, Schwaab, Mack, Blumenthal & Evans

[57] ABSTRACT

A magnetic field measuring device comprises a laser light source delivering laser light having two components of first and second frequencies; a beam splitter for dividing the laser light into two portions; a quarter wave plate provided to receive one portion of the laser light; a Faraday rotator provided to receive the output of the quarter wave plate and rotates the polarized direction thereof by an angle corresponding to a magnetic field applied thereto; first and second optical analyzers for extracting from the other portion of the laser light and the output of the Faraday rotator, first and second components of an equal frequency corresponding to the difference of the first and second frequencies, respectively; first and second photoelectric converters for converting the outputs of the first and second optical analyzers into first and second electric signals, respectively; and circuitry for comparing the first and second electric signals thereby to produce an output directly proportional to the magnetic field applied to the Faraday rotator.

2 Claims, 5 Drawing Figures

MAGNETIC FIELD MEASURING DEVICE

BACKGROUND OF THE INVENTION

This invention relates to a device for measuring magnetic field, electric current and the like by using the Faraday effect (magnetooptical effect), and more particularly to a specific type thereof which detects Faraday rotation angle for measuring the same.

Heretofore, widely known is a device which measures electric current flowing through a high voltage, heavy current electric apparatus utilizing the fact that the polarization plane of polarized light passing through a magnetooptical substance (Faraday rotor) is rotated in response to magnetic field produced by the electric current flowing around the magnetooptical substance. Such a device is more advantageous over those utilizing current transformers, in that it can be easily insulated from the high voltage of the electric apparatus, and that it does not disturb magnetic field created in the apparatus. Furthermore, the frequency characteristic of the device is better than those utilizing the current transformers.

However, since the known measuring device detects the rotated angle of the polarization plane in the form of a light intensity, the measured results tend to be affected by the loss in the optical paths. Furthermore, the results of the measurement are not proportional to the rotating angle of the polarized plane, and in a case where the measured results are converted into electrical signals by using a photoelectric converter, such as a photodiode, the electric signals tend to be deviated by a drift in the characteristics of the converter caused by temperature variation or the like.

These difficulties of the conventional device utilizing the Faraday effect will be further described in detail with reference to FIG. 1.

In FIG. 1, a laser light source 1 delivers a laser light beam 8, which is an electromagnetic wave having a component electric field $E_1$ oscillating in a plane (or a plane of polarization) at a frequency $\omega$. The laser light thus represented by the component electric field $E_1$ is delivered to a Faraday rotator 2.

An orthogonal coordinate system comprising x, y and z axes is assumed on the entrance side of the Faraday rotator 2 with the z axis extending along the center line of the rotator 2. Furthermore, orthogonal coordinates $\xi$ and $\eta$ are assumed on the output side of the Faraday rotator 2 to extend perpendicularly to the z axis extending along the center line of the rotator 2.

The component electric field $E_1$ of the laser light beam 8 delivered from the laser light source 1, with the polarization plane thereof disposed at an angle of 45° to the x axis, then transmits through the Faraday rotator 2 in the direction of the z axis, and is delivered to a Wollaston prism 4. The Wollaston prism 4 splits the linearly polarized light into two components 9 and 10.

An electric conductor 3 is wound around the Faraday rotator 2 as shown in FIG. 1. An electric current I flowing through the conductor 3 induces in the direction of z axis a magnetic field $H_z$ proportional to the current I. The magnetic field $H_z$ rotates the polarization plane of the laser light passing through the Faraday rotator 2 by an angle of F° from its original position forming 45° to the x axis. That is, the light output $E_2$ delivered from the Faraday rotator 2 is a linearly polarized light having a polarization plane rotated by an angle of 45°+F° from the x axis.

The angle F rotated by the rotator 2 is defined by the following equation $$F = V_k \cdot H_z \cdot L$$

wherein $V_k$ is the Verdet constant of the magnetooptical substance forming the Faraday rotator, and L represents the length of the Faraday rotator along the z axis. Utilizing this relation, the magnetic field $H_z$ and hence the current I proportional to the magnetic field $H_z$ can be measured by detecting the rotated angle F of the polarization plane.

Assuming that the amplitude of the component electric field E of the linearly polarized light delivered from the laser light source 1 is equal to a, the laser light having a single frequency $\omega$ is expressed by $$E_1 = a \sin \omega t$$

Since the polarization plane of the component electric field $E_1$ is disposed at 45° with respect to the x axis, the x axis and y axis components $E_x$ and $E_y$ of the electric field $E_1$ can be expressed as follows:

$$\left.\begin{array}{l} E_x = \dfrac{a}{\sqrt{2}} \sin\omega t \\ E_y = \dfrac{a}{\sqrt{2}} \sin\omega t \end{array}\right\} \quad (1)$$

When the laser light is passed through the Faraday rotator, the polarization plane thereof is rotated by an angle of F° as described above, and therefore the components $E_\xi$ and $E_\eta$ along the $\xi$ and $\eta$ axes of the light output $E_2$ outputted from the Faraday rotator can be expressed as follows:

$$\begin{pmatrix} E_\xi \\ E_\eta \end{pmatrix} = \begin{pmatrix} \cos F & -\sin F \\ \sin F & \cos F \end{pmatrix} \begin{pmatrix} E_x \\ E_y \end{pmatrix} \quad (2)$$

$$= \begin{pmatrix} \dfrac{a}{\sqrt{2}} (\cos F - \sin F)\sin\omega t \\ \dfrac{a}{\sqrt{2}} (\sin F + \cos F)\sin\omega t \end{pmatrix}$$

Thus the light output $E_2$ having the components $E_\xi$ and $E_\eta$ is also a linearly polarized light with a rotated angle $\theta = 45° + F$. of the polarization plane calculated according to the following equation.

$$\tan\theta = \dfrac{E_\eta}{E_\xi} = \dfrac{\sin F + \cos F}{\cos F - \sin F} = \tan(45° + F) \quad (2A)$$

Furthermore, from equation (2) the amplitude $|E_2|$ of the light output $E_2$ can be calculated as $$|E_2| = \sqrt{|E_\xi|^2 + |E_\eta|^2} = a$$

showing that the amplitude of the light output $E_2$ is equal to the amplitude of the input laser light.

The Wollaston prism 4 splits the light output $E_2$ into two components 9 and 10 which are $\xi$ and $\eta$ axes components $E_\xi$ and $E_\eta$, respectively. The component 9, that is the component $E_\xi$, is received by a photodiode 5, while the component 10, that is the component $E_\eta$, is received by another photodiode 6. The photodiodes 5 and 6 convert the components 9 and 10 into electric signals $I_{86}$ and $I_{72}$ which are proportional to the light intensities $|E_\xi|^2$ and $|E_{72}|^2$ of the two components 9 and 10, respectively. An electronic circuit 7 calculates $(I_\eta - I_\xi)/(I_\eta + I_\xi)$. Since $$|E_\xi| = \frac{a}{\sqrt{2}}(\cos F - \sin F) \text{ and}$$

$$|E_\eta| = \frac{a}{\sqrt{2}}(\sin F + \cos F), \tag{3}$$

$$\frac{I_\eta - I_\xi}{I_\eta + I_\xi} = \frac{|E_\eta|^2 - |E_\xi|^2}{|E_\eta|^2 + |E_\xi|^2} =$$

$$\frac{(\sin F + \cos F)^2 - (\cos F - \sin F)^2}{(\sin F + \cos F)^2 + (\cos F - \sin F)^2} =$$

$$\frac{4 \sin F \cos F}{2} = \sin 2F$$

In the conventional device shown in FIG. 1, the detected value is expressed in terms of sin2F as shown in equation (3), which is not proportional to the Faraday rotation angle F. Accordingly, another circuit for calculating the following relation is required.

$$F = \frac{1}{2}\sin^{-1}\frac{I_\eta - I_\xi}{I_\eta + I_\xi}$$

Furthermore, since the same result is obtained for a variation of F of 180°, there is another difficulty that the measuring range of F is restricted to ±90°.

The most serious difficulty of the device shown in FIG. 1 lies in that the characteristics of the photodiodes 5 and 6 tend to drift when the diodes convert the light intensities $|E_{86}|^2$ and $|E_\eta|^2$ into electric signals $I_\xi$ and $I_\eta$. More specifically, a dark current tends to flow in each photodiode besides the electric signal $I_\xi$ or $I_\eta$. The dark current varies in accordance with the temperature variation of the photodiode, thereby causing a drift in the operational characteristics of the photodiode. When the adverse effect of the dark current is desired to be eliminated, a complicated circuit must further be provided in addition to those indicated in FIG. 1.

Furthermore, when it is desired to measure accurately, the photoelectric conversion ratios of the two diodes 5 and 6 must be equal. However, when considering variation in characteristics of the photodiodes over many years it is extremely difficult to maintain the photoelectric conversion ratios of the two diodes to be equal.

SUMMARY OF THE INVENTION

An object of the present invention is to provide a magnetic field measuring device wherein the above described difficulties of the conventional device can be substantially eliminated.

A more specific object of the invention is to provide a magnetic field measuring device wherein a optical superheterodyne technique is utilized for the demodulation, and a detected electric signal having a phase angle proportional to the Faraday rotation angle, and hence to the magnetic field to be measured can be obtained.

Another object of the invention is to provide a magnetic field measuring device wherein the detected electric signal is free from the transmission loss of the laser light and the drift in the operational characteristics of the photoelectric converters.

These and other objects of the present invention can be achieved by a magnetic field measuring device comprising a laser light source, a Faraday rotator provided to receive laser light from the laser light source, and to deliver an output laser light modulated or varied with a quantity to be measured, an optical analyzer provided to receive the light output of the Faraday rotator, and to extract a component of the light output polarized in a predetermined direction, and a photoelectric converter for converting the extracted component into an electric signal, characterized in that the laser light source produces laser light having two components of a first frequency and a second frequency, which are polarized in directions perpendicular to each other, and that the measuring device further comprises a beam splitter dividing the laser light into a first portion and a second portion; a first optical analyzer extracting from the first portion of the laser light a component which is polarized at an angle 45° with respect to the x and y axes and having a frequency corresponding to the difference between the first frequency and the second frequency; a quarter wave length plate disposed to receive the second portion of the laser light from the beam splitter and delivers an output, the optical principal axis of which is set at an angle of 45° with respect to x and y axis; a Faraday rotator receiving the output of the quarter wave length plate and delivering an output, the polarizing direction of which being rotated by an angle corresponding to a magnetic field applied thereto; a second optical analyzer which extracts from the ouput of the Faraday rotator a component having a frequency equal to the difference between the first and second frequencies and phase modulated by the rotated angle of the polarizing direction in the Faraday rotator; first and second photoelectric converters which convert the outputs of the first and second optical analyzers into first and second electric signals, respectively; and circuit means which compare the first and second electric signals for producing an output directly proportional to the magnetic field applied to the Faraday rotator.

PREFERRED EMBODIMENTS OF THE INVENTION

Figure 1:
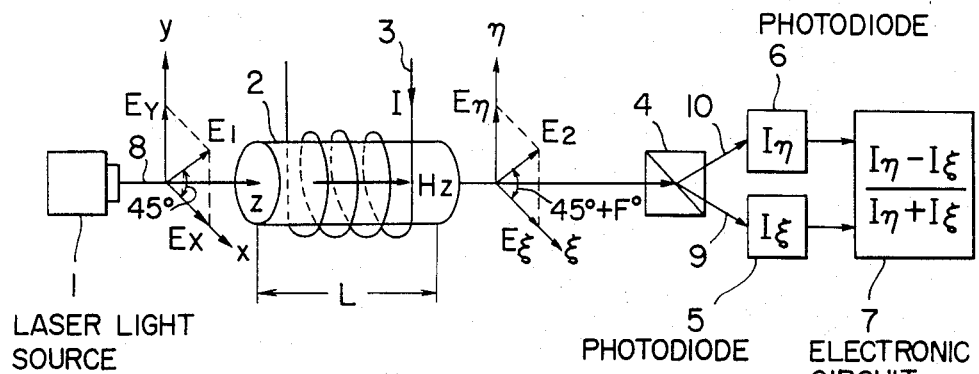
FIG. 1 is a diagrammatic representation showing the construction of a conventional magnetic field measuring device utilizing the Faraday effect.
Figure 2:
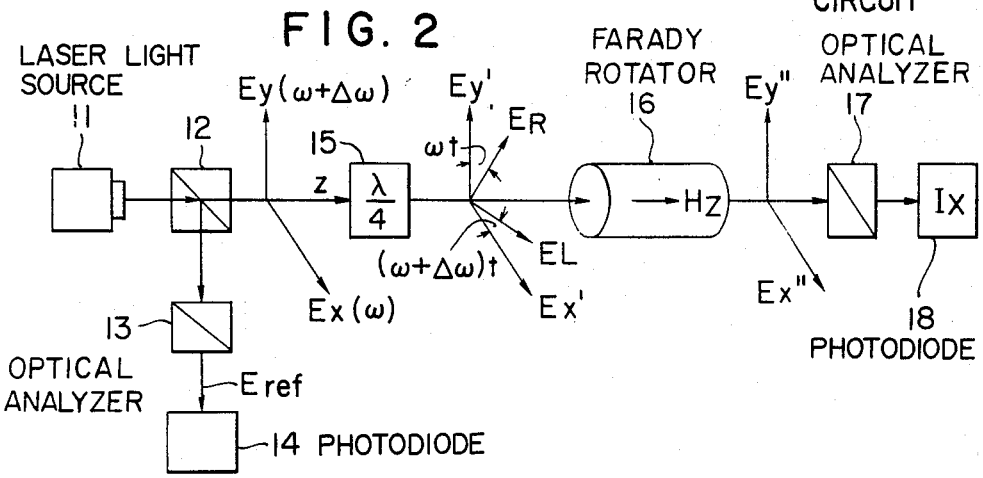
FIG. 2 is a diagrammatic representation showing an optical system constituting an important portion of the magnetic field measuring device according to the present invention.

An optical system constituting a portion of the measuring device according to the present invention will first be described with reference to FIG. 2. A two-frequency laser light source 11 emits in the direction of z axis a linearly polarized laser light having an x axis component $E_x$ oscillating at a light frequency of $\omega$, and a y axis component $E_y$ oscillating at another light frequency $\omega + \Delta\omega$. A suitable two frequency laser light source utilizing the Zeeman effect is available on the market. Since the frequency difference $\Delta\omega$ in the output of the laser source is in the order of $2\pi \times 1.2 \times 10^6$ (rad/s), any of known photodiodes can respond to the frequency difference. Instead of the above described laser light source utilizing Zeeman effect, an ordinary lateral mode laser device producing two frequency components of $\omega$ and $\omega + \Delta\omega$ which are linearly polarized in directions perpendicular to ech other may be used for this purpose. Furthermore, a device comprising a optical frequency shifter such as a Bragg cell and capable of providing a frequency $\omega + \Delta\omega$ based on a frequency $\omega$ may be utilized as the laser light source 11.

The output of the laser light source 11 including two frequency components polarized in directions perpendicular to each other transmits in the direction of z axis through a beam splitter 12 which splits the laser light into two portions. One portion of the laser light having two components $E_x$ and $E_y$ as shown in FIG. 2 is then passed through a quarter wave ($\lambda/4$) plate 15. The other portion of the laser light delivered from the beam splitter 12 is passed through an optical analyzer 13.

When it is assumed that the amplitudes of the two components $E_x$ and $E_y$ of the first portion of the laser light delivered from the beam splitter 12 are both $$\frac{a}{\sqrt{2}},$$

the components $E_x$ and $E_y$ are expressed as follows.

$$\left.\begin{array}{l} E_x = \frac{a}{\sqrt{2}} \sin\omega t \\ E_y = \frac{a}{\sqrt{2}} \sin(\omega + \Delta\omega)t \end{array}\right\} \quad (4)$$

When the linearly polarized light having the components $E_x$ and $E_y$ expressed by equation (4) passes through the quarter wave plate 15, the optical principal axis of which being disposed in a direction on forming an angle of 45° with respect to x axis, the component $E_x$ is converted into a right circular polarized light $E_R$, the x axis and y axis components $E_{Rx}$ and $E_{Ry}$ of which being expressed by $$E_{Rx} = \frac{a}{2}\sin\omega t \text{ and } E_{Ry} = \frac{a}{2}\cos\omega t,$$

while the component $E_y$ is converted into a left circular polarized light $E_L$, the x axis and y axis components $E_{Lx}$ and $E_{Ly}$ of which being expressed by $$E_{Lx} = \frac{a}{2}\cos(\omega + \Delta\omega)t \text{ and } E_{Ly} = \frac{a}{2}\sin(\omega + \Delta\omega)t,$$

respectively.

Accordingly, the resultant x axis and y axis components $E_x'$ and $E_y'$ of the laser light delivered from the quarter wave plate 15 are expressed as follows.

$$\left.\begin{array}{l} E_x' = E_{Rx} + E_{Lx} = \frac{a}{2}[\sin\omega t + \cos(\omega + \Delta\omega)t] \\ E_y' = E_{Ry} + E_{Ly} = \frac{a}{2}[\cos\omega t + \sin(\omega + \Delta\omega)t] \end{array}\right\} \quad (5)$$

When the components $E_x'$ and $E_y'$ of the laser light delivered from the quarter wave plate 15 are passed through a Faraday rotator 16, the polarization angle of the laser light is rotated by an angle of F° as described hereinbefore, so that the output components $E_x''$ and $E_y''$ of the Faraday rotator 16 are expressed by $$\begin{pmatrix} E_x'' \\ E_y'' \end{pmatrix} = \begin{pmatrix} \cos F & -\sin F \\ \sin F & \cos F \end{pmatrix} \begin{pmatrix} E_x' \\ E_y' \end{pmatrix} \quad (6)$$

From equation (6)

$$E_x'' = E_x'\cos F - E_y'\sin F \quad (7)$$

By substituting equations (5) into equation (7) we obtain $$E_x'' = \frac{a}{2}[\cos F(1 - \sin\Delta\omega t) - \sin F\cos\Delta\omega t]\sin\omega t +$$

$$\frac{a}{2}[\cos F\cos\Delta\omega t - \sin F(1 + \sin\Delta\omega t)]\cos\omega t =$$

$$|E_x''|\sin(\omega t + \delta$$

wherein $$\tan\delta = \frac{\cos F\cos\Delta\omega t - \sin F(1 + \sin\Delta\omega t)}{\cos F(1 - \sin\Delta\omega t) - \sin F\cos\Delta\omega t} \quad (8)$$

$$|E_x''| = \frac{a}{\sqrt{2}}\sqrt{1 - \sin(\Delta\omega t + 2F)}$$

Another optical analyzer 17 provided on the output side of the Faraday rotator 16 is so constructed that it passes only the x axis component $E_x''$ toward a photodiode 18. Upon reception of the x axis component $E_x''$, the photodiode 18 delivers an electric signal $I_x$ which is proportional to optical intensity $|E_x''|^2$ shown by $$I_x = |E_x''|^2 = \frac{a^2}{2}[1 - \sin(\Delta\omega t - 2F)] \quad (9)$$

When $\Delta\omega$ frequency component of the electric signal $I_x$ is extracted by a filter as described hereinlater, an electric signal of a frequency $\Delta\omega$ phase-modulated by twice the Faraday rotation angle F can be obtained. A technique extracting a frequency component equal to the difference between two light frequencies $\omega$ and $\omega + \Delta\omega$ is hereinafter termed optical superheterodyne technique.

The other portion of the laser light delivered from the beam splitter 12 to the optical analyzer 13 is also linearly polarized having x axis and y axis components similar to $E_x$ and $E_y$ The optical analyzer 13 is so disposed that it passes a linearly polarized light polarized in a direction of 45° with respect to x axis. Accordingly, the output of the optical analyzer designated by $E_{ref}$ is expressed by the following equation:

$$E_{ref} = \frac{1}{\sqrt{2}} (E_x + E_y)$$

$$= \frac{a}{2} [\sin\omega t + \sin(\omega + \Delta\omega)t]$$

$$= \frac{a}{2} [(1 + \cos\Delta\omega t)\sin\omega t + \sin\Delta\omega t\cos\omega t]$$

$$= |E_{ref}| \sin(\omega t + \delta')$$

wherein $$\tan\delta' = \frac{\sin\Delta\omega t}{1 + \cos\Delta\omega t} \quad (10)$$

$$|E_{ref}| = \frac{a}{\sqrt{2}} \sqrt{1 + \cos\Delta\omega t}$$

The light $E_{ref}$ from the optical analyzer 13 is applied to a photodiode 14 which delivers an electric signal $I_{ref}$ proportional to the optical intensity $|E_{ref}|^2$.

$$I_{ref} = |E_{ref}|^2 = \frac{a^2}{2}(1 + \cos\Delta\omega t) \quad (11)$$

By extracting the frequency component $\Delta\omega$ from the electric signal $I_{ref}$, a reference electric signal of the frequency $\Delta\omega$ can be obtained.

An electronic circuit constituting another portion of the measuring device according to the present invention will now be described in detail with reference to FIGS. 3 and 4.

Figure 3:
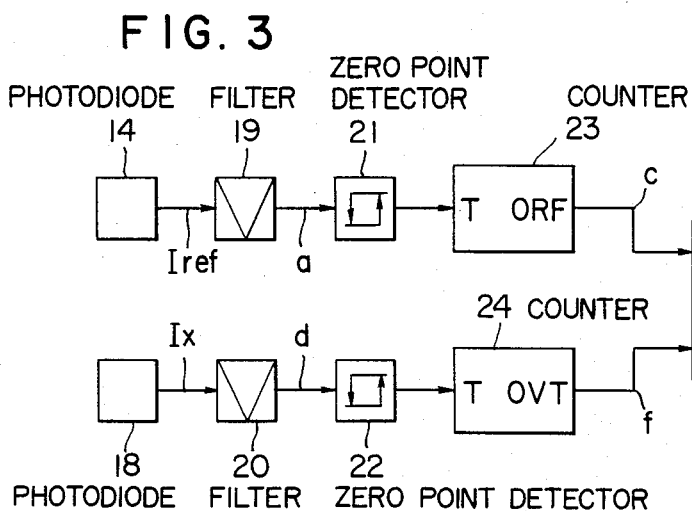
FIG. 3 is a block diagram showing an electric circuit consituting another portion of the measuring device of this invention.

In FIG. 3, photodiodes 14 and 18 of FIG. 2 are again illustrated. The photodiode 14 delivers the reference electric signal $I_{ref}$ of equation 11, and a filter 19 supplied with the reference signal $I_{ref}$ extracts the frequency component $\Delta\omega$. The output a of the filter 19 is a sinusoidal wave having no DC component as indicated by a curve (a) in FIG. 4. The output a is passed through a zero-point detector 21 so that the waveform thereof is changed as desired. Each time the output of the filter 19 goes up from a negative value to a positive value passing through a zero-point, the zero-point detector 21 triggers a three-stage counter 23. The triggering of the counter 23 sequentially changes the status of the counter 23 in the order of 1, 2 and 3 as shown by curve (b) in FIG. 4, and when the status is changed from 3 to 1, the counter 23 delivers an output pulse C, as shown by curve (c) in FIG. 4, to the reset terminal R of a flip-flop 25 for resetting the same.

On the other hand, another frequency component $\Delta\omega$ is extracted from the output electric signal $I_x$ delivered from the photodiode 18, which is phase modulated by twice the Faraday rotation angle F as defined in equation (9). The frequency component of $\Delta\omega$ has a sinusoidal waveform as shown in curve (d) in FIG. 4. Each time another zero-point detector 22 detects a zero point through which the sinusoidal wave shown by curve (d) in FIG. 4 goes up from a negative value to a positive value, a zero point detector 22 triggers another three-stage counter 24. The triggering of the counter 24 sequentially changes the status of the counter 24 in the order of 1, 2 and 3 as indicated by curve (e) of FIG. 4, and when the status is changed from 3 to 1, the counter 24 delivers output pulses f as shown by curve (f) in FIG.

4. The output pulses f are supplied to the set terminal S of a flip-flop 25. The time interval in which the flip-flop 25 is reset is $3.5\pi - 2$ F (rad), while the time interval in which the flip-flop 25 is set is $2.5\pi + 2$ F (rad) as shown by curve (g) in FIG. 4.

Figure 4:
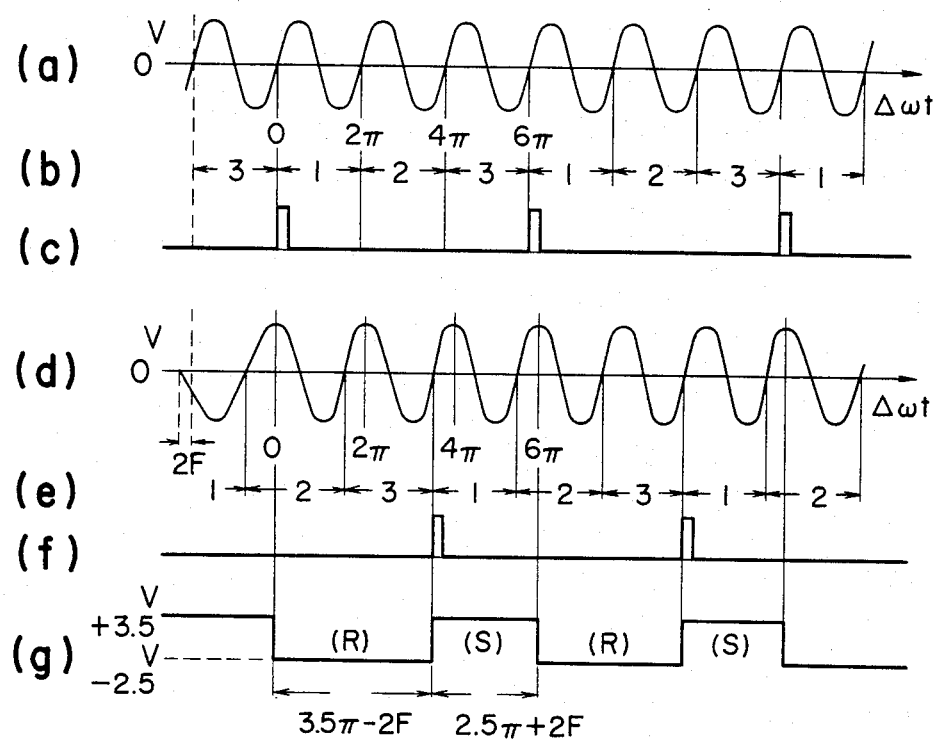
FIG. 4 is a graph showing waveforms and the timings of occurrence of electric signals in the circuit shown in FIG. 3.

The flip-flop 25 delivers an output g as shown by curve (g) in FIG. 4, which has a value of $+3.5$ V when the flip-flop 25 is set, and $-2.5$ V when the flip-flop 25 is reset. A RC type low-pass filter 26 is connected to receive the output g of the flip-flop 25, and delivers an average DC voltage v as shown by the following equation.

$$v = \frac{3.5(2.5\pi + 2F) - 2.5(3.5\pi - 2F)}{6\pi} \quad (12)$$

$$= \frac{2F}{\pi} (V)$$

which is exactly proportional to the Faraday rotation angle F. As is apparent from equation (12), the measuring device according to this invention has another advantageous feature that the measured results are not influenced by the variation of the heterodyne frequency difference $\Delta\omega$. Furthermore, since the DC components of the electric signals $I_{ref}$ and $I_x$ are eliminated by the filters 19 and 20, the measured results are not affected by the drift in the operation characteristics of the photodiodes 14 and 18. The zero-point detectors 21 and 22 detect zero points irrespective of the amplitudes of the $\Delta\omega$ frequency components a and d of the electric signals $I_{ref}$ and $I_x$, and therefore the precision of the measurement is not affected by either the intensity of the laser light delivered from the laser source 11, or by the variation in the characteristics of the photodiodes 14 and 18 caused by aging.

The embodiment of the invention having an electric circuit as shown in FIG. 3 has a measuring range of $\pm +1.5\pi$ (rad) for the Faraday rotation angle F. However, the measuring range can be increased as desired by increasing the number of stages in the counters 23 and 24.

Figure 5:
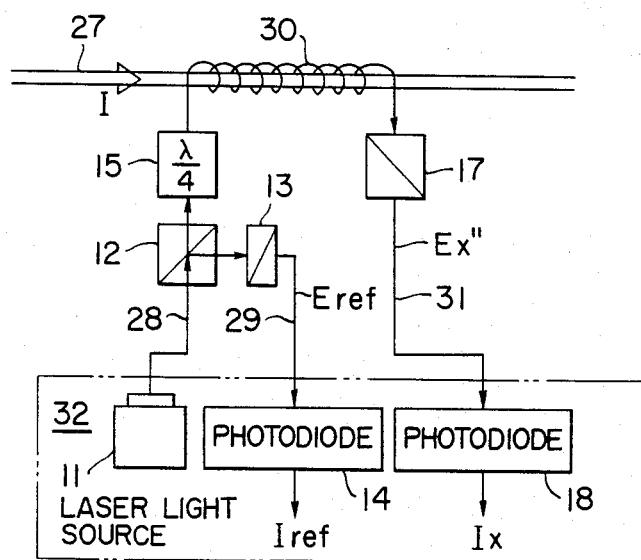
FIG. 5 is a connection diagram showing the construction of another embodiment of the present invention.

Another embodiment of the present invention wherein a current I flowing through an extra-high voltage conductor 27 is measured is illustrated in FIG. 5. In this embodiment, a several turns of a single-mode optical fiber 30 are wound around the conductor 27, so that the current I flowing through the conductor 27 is determined from a rotating angle of the polarization plane of a laser light passing through the optical fiber 30. More specifically, two-frequency laser light source 11 in this embodiment produces a laser light having a component oscillating at a light frequency $\omega$ and another component oscillating at a light frequency $\omega + \Delta\omega$, both components being perpendicular to each other. The laser light delivered from the source 11 then transmits through a polarization plane reserving optical fiber 28 to a beam splitter 12. At the beam splitter 12, the laser light is split into two portions, one portion of which transmits through a quarter wave length plate 15 into the single mode optical fiber 30 with the Faraday effect, while the other portion of which is delivered into an optical analyzer 13. The output of the optical fiber 30 having the polarization plane rotated under the Faraday effect then enters into another optical analyzer 17 which extracts only a predetermined polarization component $E_x''$ of equation (8). The component $E_x''$ is then sent through another optical fiber 31 to a photodiode 18 which converts the component $E_x''$ into an electric signal $I_x$ of equation (9) oscillating with the frequency difference $\Delta\omega$. The optical fiber 31 can transmit the optical intensity modulation signal of equation (9) correctly regardless of its length in case where the frequency range thereof is higher than $\Delta\omega$. Furthermore, since the measurement of the present invention is based on a principle not disturbed by the optical loss in the fiber 31, the phase modulation data 2 F of equation (9) can be transmitted over a long distance through the fiber 31.

Another portion of laser light delivered from the beam splitter 12 is received by the optical analyzer 13 which picks up only a component $E_{ref}$, the amplitude of which is indicated by equation (10). The output of the optical analyzer 13 is delivered through still another optical fiber 29 to another photodiode 14 which converts the output into an electric signal $I_{ref}$ of equation (11). The optical fiber 29 can transmit the reference phase data correctly regardless of the length of the optical fiber 29 in case where the frequency range thereof is higher than $\Delta\omega$. Accordingly, a measured value of the current I flowing through the extra-high voltage conductor 27 can be transmitted precisely to a station 32 located remote from the conductor 27, regardless of the cases where noises caused by lightning are intensive.

Heretofore, when a Faraday rotation in a single-mode optical fiber 30 is transmitted over a long distance to the station 32, the rotation data F has been disturbed while the light transmits therebetween, and correct data could not be obtained at the station 32. According to the present embodiment, the Faraday rotation data can be transmitted at a high precision regardless of the optical loss and variation in the polarization status caused in the long transmission line, so that the current I flowing through the extra-high voltage conductor can be measured precisely.

I claim:

1. A magnetic field measuring device comprising:
   a laser light source for delivering laser light having x and y axes components having a first frequency and a second frequency, respectively;
   a beam splitter for dividing said laser light into first and second portions;
   a first optical analyzer provided to receive the first portion delivered from the beam splitter for delivering a component polarized at an angle of 45° with respect to the x and y axes, and the optical intensity of which being modulated at a frequency corresponding to the difference of said first and second frequencies, and having reference phase;
   a quarter wave plate provided to receive the second portion delivered from the beam splitter for delivering an output, the principal axis direction of which being set at an angle of 45° with respect to x and y axes;
   a Faraday rotator for receiving the output of said quarter wave plate for rotating the same by an angle corresponding to a magnetic field applied thereto;
   a second optical analyzer for extracting from the output of the Faraday rotator a predetermined polarization component, and the optical intensity of which being modulated at a frequency equal to the difference between the first and second frequencies, and phase modulated by twice the rotated angle produced by said Faraday rotator;
   first and second photoelectric converters for converting outputs of the first and second optical analyzers into first and second electric signals, respectively; and
   means for comparing the phase difference between said first and second electric signals thereby to produce an output directly proportional to the magnetic field applied to the Faraday rotator.

2. A magnetic field measuring device as set forth in claim 1, wherein said means for comparing comprises first and second filters for eliminating DC components contained in the first and second electric signals delivered from the first and second photoelectric converters, respectively tively; first and second three-stage counters the status of which changes in a predetermined order each time the electric signal delivered from the corresponding filter goes up through a zero point from a negative value to a positive value, and delivering an electric pulse each time the status of the counters is changed from a highest to a lowest status; and a flip-flop circuit which is set by an output pulse from the first counter and reset by an output pulse from the second counter.

* * * * *